(12) United States Patent
Prasher et al.

(10) Patent No.: US 7,218,519 B2
(45) Date of Patent: May 15, 2007

(54) THERMAL MANAGEMENT ARRANGEMENT WITH A LOW HEAT FLUX CHANNEL FLOW COUPLED TO HIGH HEAT FLUX CHANNELS

(75) Inventors: Ravi S. Prasher, Tempe, AZ (US); Gregory M. Chrysler, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 359 days.

(21) Appl. No.: 10/869,186

(22) Filed: Jun. 15, 2004

(65) Prior Publication Data
US 2005/0276014 A1    Dec. 15, 2005

(51) Int. Cl.
H05K 7/20 (2006.01)
H01L 23/34 (2006.01)

(52) U.S. Cl. ............. 361/700; 361/699; 361/718; 165/80.4; 165/104.33; 257/714; 257/715

(58) Field of Classification Search ........ 361/698–702, 361/717–718; 257/714–715; 165/80.4, 165/80.5, 104.33, 165
See application file for complete search history.

(56) References Cited

U.S. PATENT DOCUMENTS

| 5,998,240 | A  | * | 12/1999 | Hamilton et al. | ........... 438/122 |
| 6,942,018 | B2 | * | 9/2005  | Goodson et al.  | ........... 165/80.4 |
| 7,110,258 | B2 | * | 9/2006  | Ding et al.     | ............... 361/699 |
| 2003/0062149 | A1 | * | 4/2003 | Goodson et al. | ....... 165/104.11 |

OTHER PUBLICATIONS

Kandlikar, S. G., "A General Correlation for Saturated Two-Phase Flow Boiling Heat Transfer Inside Horizontal and Vertical Tubes," Journal of Heat Transfer, Transactions of the ASME, Feb. 1990, vol. 112, pp. 219-228.

* cited by examiner

*Primary Examiner*—Michael Datskovsky
*Assistant Examiner*—Robert J. Hoffberg
(74) *Attorney, Agent, or Firm*—Schwabe, Williamson & Wyatt, P.C.

(57) ABSTRACT

Embodiments of the present invention include an apparatus, method, and system for a thermal management arrangement having a low heat flux channel flow coupled to high heat flux channels.

28 Claims, 4 Drawing Sheets

THERMAL MANAGEMENT ARRANGEMENT WITH A LOW HEAT FLUX CHANNEL FLOW COUPLED TO HIGH HEAT FLUX CHANNELS

FIELD OF THE INVENTION

Disclosed embodiments of the present invention relate to the field of thermal management for semiconductor packages, and more particularly to a thermal management arrangement with a low heat flux channel flow coupled to high heat flux channels.

BACKGROUND OF THE INVENTION

Thermal management is of great importance to the operation of semiconductor devices. Thermal management is especially important in the operation of microprocessors as relentlessly increasing frequency targets push power output, and therefore heat generation, to the limits of the cooling capacity of passive air-cooled heatsink technology. Insufficient transfer of heat away from a semiconductor device can result in degradation of the performance and reliability of that device or circuit.

Recent focus has turned to thermal management arrangements utilizing fluid flowing through parallel channels to dissipate heat. The channels each have similar dimensions and each have an input to receive fluid from a common inlet coupled to a remote pump, and an output to transmit the fluid to a common outlet towards a heat exchanger. This prior art design may result in undesirable flow distributions among the channels due to a large portion of the fluid flowing through the channels in-line with the common inlet and outlet, while the channels at the periphery of the thermal management device may have significantly smaller flows. Additionally, across die temperature gradients may reduce the volumetric flow rates through high heat flux channels along with a corresponding increase in the flow rates through low heat flux channels.

BRIEF DESCRIPTION OF THE DRAWINGS

Embodiments of the invention are illustrated by way of example and not by way of limitation in the figures of the accompanying drawings, in which the like references indicate similar elements and in which.

DETAILED DESCRIPTION OF EMBODIMENTS OF THE INVENTION

A novel method, apparatus, and system for channels of a thermal management arrangement designed for cooling a semiconductor package with varying heat fluxes is disclosed herein. In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the embodiments of the present invention. It should also be noted that directions and references (e.g., top, bottom, back, front, etc.) might be used to facilitate the discussion of the drawings but are not intended to restrict the application of the embodiments of this invention. Therefore, the following detailed description is not to be taken in a limiting sense and the scope of the embodiments of the present invention are defined by the appended claims and their equivalents.

Figure 1:
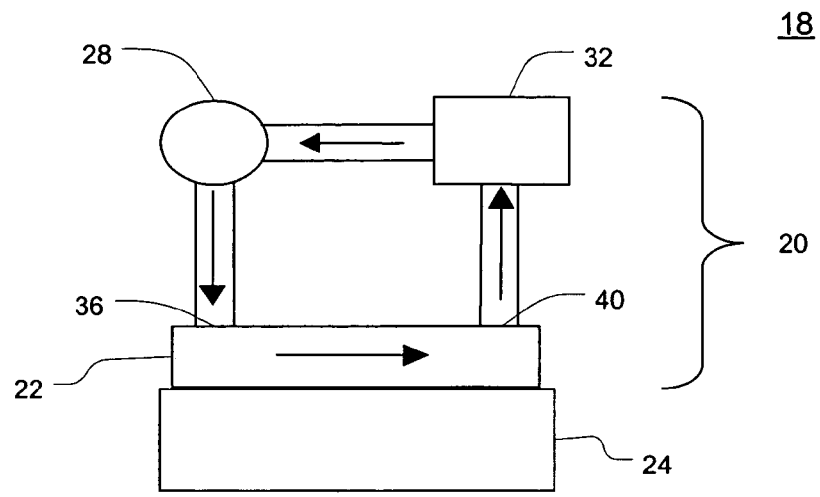
FIG. 1 illustrates a cross-sectional view of an electronic assembly including a thermal management arrangement coupled to a semiconductor package, in accordance with an embodiment of the present invention.

FIG. 1 illustrates a cross-sectional view of an electronic assembly 18 including a thermal management arrangement 20 in accordance with an embodiment of this invention. In this embodiment the thermal management arrangement 20 may be coupled to a semiconductor package 24 in order to facilitate the management of heat generated by the semiconductor package 24. The thermal management arrangement may include a channel structure 22 having a number of channels designed to thermally couple a cooling fluid to the semiconductor package 24 to allow the cooling fluid to absorb at least a portion of the heat generated by the semiconductor package 24. Furthermore, the channels may be designed to adapt fluid flows to respective heat flux areas that may correspond to areas of varying heat output by the semiconductor package 24. In various embodiments the channel structure 22 may include, but is not limited to, a cold plate, an integrated heat spreader, or part of the semiconductor package 24 itself. The materials and design of the channel structure 22 are not restricted beyond what it takes to accommodate such channels. In one embodiment the channel structure 22 may be made of a conductive material (e.g., copper).

In one embodiment, a thermal interface material may be used to couple the semiconductor package 24 to the channel structure 22 in order to decrease the thermal resistance in the pathway between the semiconductor package 24 and the fluid. Examples of types of thermal interface materials include, but are not limited to, a thin layer of solder paste, phase-change materials, thermal adhesives (e.g., a highly filled epoxy or acrylic), double-sided thermal tape, and thermal interface pads. In another embodiment the channel structure 22 may be coupled to an integrated heat spreader (not shown) that is thermally coupled to the semiconductor package 24.

In one embodiment a pump 28 may be used to create a pressure differential between an inlet 36 and an outlet 40 to facilitate the flow of the fluid through the channels. The fluid may absorb at least a portion of the heat dissipated from the semiconductor package 24 as it flows through the channels of the channel structure 22. The heated fluid may flow out of the outlet 40 and towards a remote heat exchanger 32. The heat may then be transferred to the heat exchanger 32, which could be any known or to-be-designed heat dissipation mechanism. In one embodiment the heat exchanger 32 may dissipate thermal energy from the cooling fluid and present the fluid to the pump 28 so that it may be reintroduced to the channel structure 22. Examples of the cooling fluid may include, but are not limited to a gas (e.g., air) and a liquid (e.g., water, alcohol, perfluorinated liquids, etc.).

Various embodiments of this invention may include thermal management arrangements employing a variety of heat transfer techniques analogous to the heat transfer technique described in FIG. 1. For example, in one embodiment a thermal management arrangement may use mechanical refrigeration, such as a vapor-compression cycle. The vapor-compression cycle may include at least partially evaporating a liquid cooling fluid through a channel structure, similar to the channel structure 22 of FIG. 1. The at least partially evaporated cooling fluid may then enter a compressor where the pressure and temperature may be raised. The superheated cooling fluid may then move to a condenser (e.g., a heat exchanger) and discharge at least a portion of its heat. The fluid may then expand from the high-pressure level in the condenser to a low-pressure level through an expansion valve for reintroduction to the channels of the channel structure. Other embodiments may use other refrigeration processes including, but not limited to, absorption, steam-jet, and air cycles. Still other embodiments may use other heat transfer techniques in order to dissipate thermal energy absorbed by the cooling fluid and reintroduce the fluid to the channel structure.

In one embodiment, the semiconductor package 24 could include an integrated circuit (IC) formed in a piece of semiconductor material called a chip or a die. Examples of semiconductor materials could include, but are not limited to silicon, silicon on sapphire, and gallium arsenide. A die may include different areas with different levels of activity. An active area of the die, e.g., a core logic area, may output more heat than a passive area of the die, e.g., a cache. The two areas of the channel structure 22 that correspond to these different heat output areas may be referred to as a high heat flux area and a low heat flux area, respectively. While this embodiment discusses two heat output areas, other embodiments consistent with the scope of this invention may accommodate a number of heat output gradients of varying degrees over the surface of the die.

In one embodiment, the fluid flowing through channels that travel through the high heat flux area may result in different flow dynamics than fluid flowing through channels that travel only through the low heat flux area. Prior art devices not accounting for these variant flow dynamics may result in undesired and/or unintended flow distributions over the range of channels. For example, liquid flowing through the high heat flux channels may begin to boil in two-phase flow. As liquid turns into vapor, the vapor has to accelerate to satisfy the law of conservation of mass. This acceleration of vapor may lead to large pressure drops in the high heat flux channels. Because the pressure drop between the common inlet and the outlet is fixed, the greater pressure drop in the high heat flux channels may lead to a decrease in the volumetric flow rate through those channels, which may result in a corresponding increase in the volumetric flow rate through the low heat flux channels. This decrease in flow rate through the high heat flux channels may reduce the heat transfer coefficient, thereby potentially compromising the ability to transfer heat from the area that most needs it.

Figure 2:
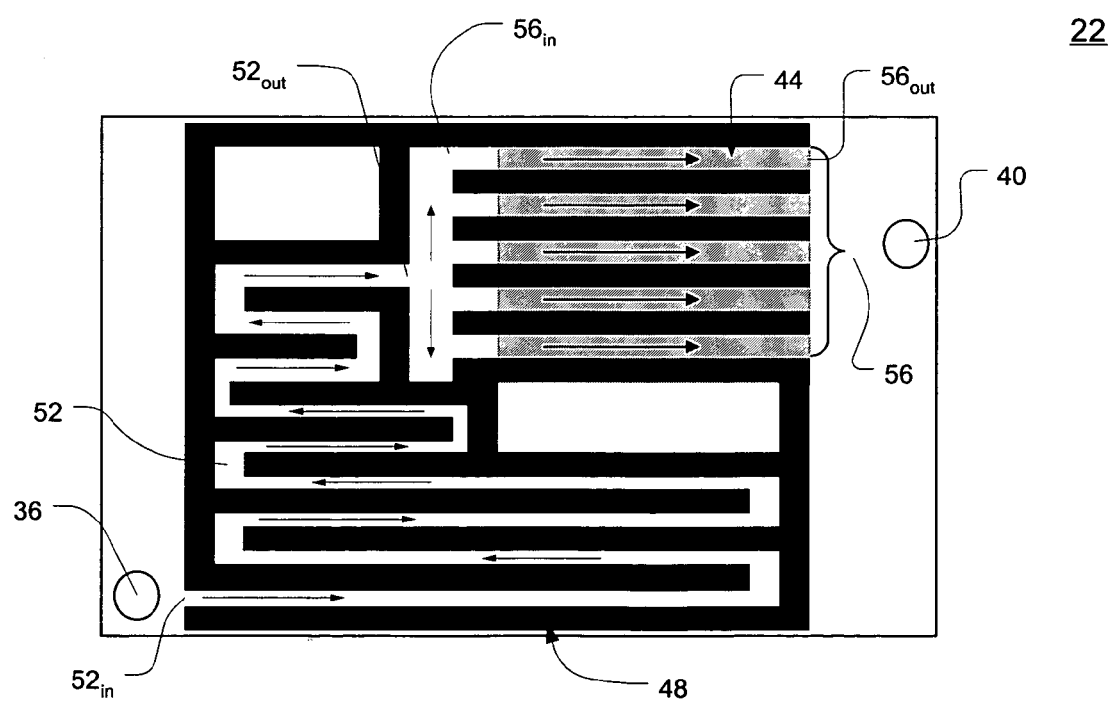
FIG. 2 illustrates a top view of high heat flux and low heat flux channels of a channel structure, in accordance with an embodiment of the present invention.

FIG. 2 illustrates a top view of channels of the channel structure 22 that may be designed to accommodate varying heat fluxes, in accordance with an embodiment of this invention. In this embodiment the channel structure 22 may have a high heat flux area 44 and a low heat flux area 48. The inlet 36 may be flow coupled with an input $52_{in}$ of a low heat flux channel 52, such that at least a portion of fluid entering the channel structure 22 at the inlet 36 flows into the low heat flux channel 52. The low heat flux channel 52 may travel through at least a portion of the low heat flux area 48. The low heat flux channel 52 may have an output $52_{out}$ that is flow coupled with inputs $56_{in}$ of high heat flux channels 56, such that at least a portion of the fluid flowing out of the low heat flux channel 52 flows into at least some of the high heat flux channels 56. The high heat flux channels 56 may be arranged in a substantially parallel manner through at least a portion of a high heat flux area 44. The high heat flux channels 56 may have outputs $56_{out}$ that are flow coupled with the outlet 40 of the channel structure 22.

In this embodiment, an influent flow entering the channel structure 22 may be directed into the low heat flux channel 52. At the low heat flux channel output $52_{out}$ the fluid may be apportioned into the high heat flux channels 56. Because the pressure drop of the high heat flux channels 56 is approximately the same, there may be an approximately equal distribution of fluid throughout the high heat flux channels 56.

Figure 3:
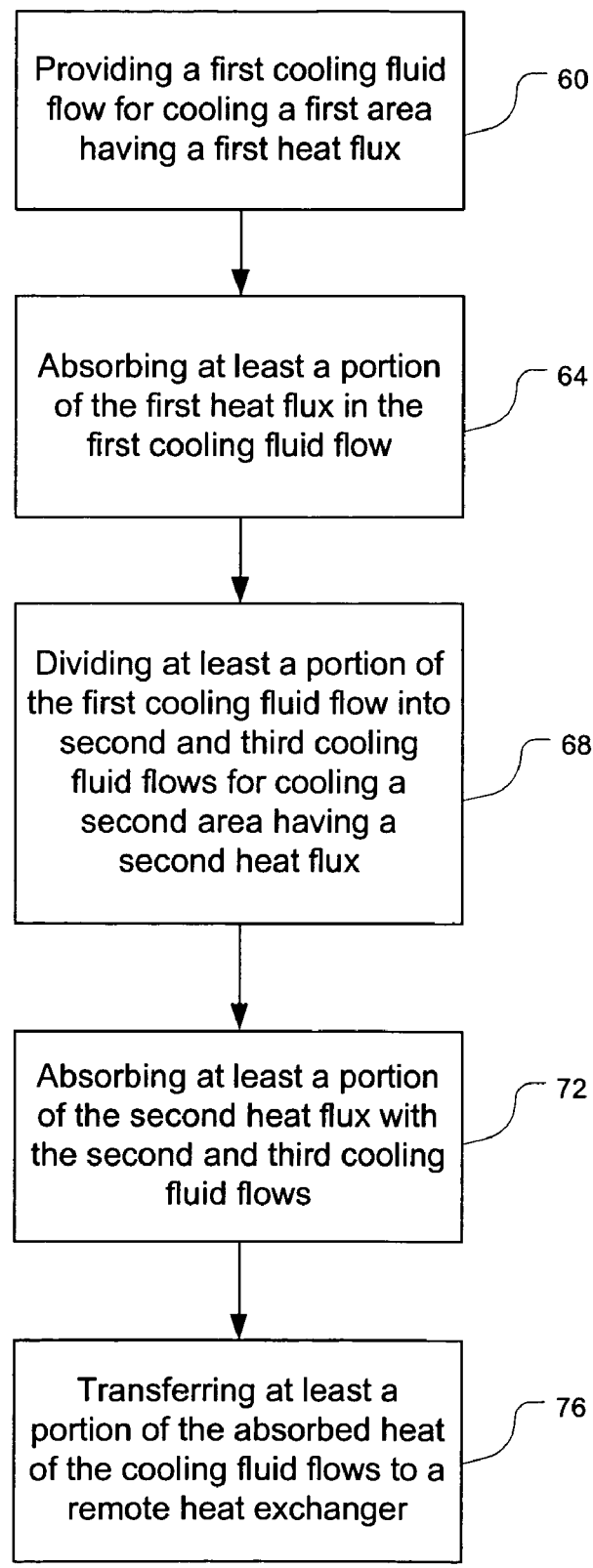
FIG. 3 depicts a flow chart describing a method of operation of a thermal management arrangement, in accordance with an embodiment of the present invention.

FIG. 3 depicts a flow diagram describing the fluid flows through a channel structure similar to the channel structure 22 of FIG. 2, in accordance with one embodiment of this invention. In this embodiment a first flow may be provided for cooling a first area having a first heat flux 60. As the first fluid flows through the first area it may absorb at least a portion of the heat from the first area 64. At least a portion of the first fluid flow may then be divided into second and third fluid flows for cooling a second area having a second heat flux 68. As the second and third fluid flows through the second area they may absorb at least a portion of the heat from that area 72. The second and third fluid flows may carry away the absorbed heat and transfer at least a portion of the heat to a remote heat exchanger 76. In one embodiment, the first heat flux may be less than the second heat flux.

Referring again to FIGS. 1 and 2, the amount of heat that the thermal management arrangement 20 is capable of transferring away from the high heat flux area 44 may be an operating constraint for an IC disposed in the semiconductor package 24. Therefore, one embodiment may focus the limited heat transferring capability of a cooling fluid on the high heat flux area 44. The thermal management arrangement 20 may accomplish this by constraining the heat absorption through the low heat flux area 48, thereby preserving the heat absorption capabilities for the high heat flux area 44.

In one embodiment, the heat absorption through the low heat flux channel 52 may be constrained by restricting the fluid to single-phase flow. Fully developed single-phase flow, which may have a lower heat transfer coefficient than two-phase flow, may provide sufficient heat transfer for the low heat flux area 48 while preserving heat absorbing capacity for the high heat flux area 44. Various embodiments may adjust a number factors in order to restrict a flow to single-phase including, but not limited to the hydraulic diameter of the low heat flux channel 52, the flow rate, and the flow distance through the low heat flux area 48.

In one embodiment, the cooling fluid may then develop into two-phase flow through the high heat flux channels 56. With an increased heat transfer coefficient and remaining heat absorbing capacity, the cooling fluid may be capable of absorbing and dissipating significant amounts of heat from the high heat flux area 44. In one embodiment, as the cooling fluid flows through the low heat flux channel 52 its temperature may rise to a point just under the boiling temperature of the fluid. As the fluid progresses from the low heat flux channel 52 to the high heat flux channels 56, the cooling fluid may quickly develop into a two-phase flow. In various embodiments, the fluid may experience two-phase flow in the low heat flux channel 52.

Figure 4:
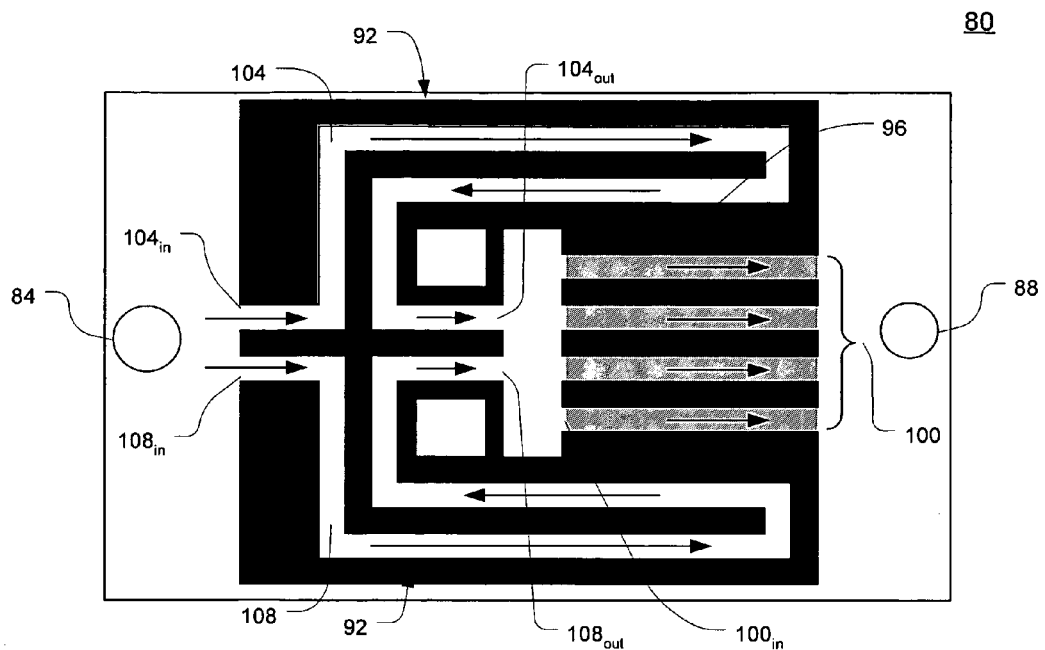
FIG. 4 illustrates a top view of a channel structure with dual low heat flux channels, in accordance with an embodiment of the present invention.

FIG. 4 illustrates a channel structure 80 having low heat flux channels, in accordance with an embodiment of the present invention. The channel structure 80 may be interchangeable with the channel structure 22 of FIGS. 1 and 2. The channel structure 80 may have an inlet 84, an outlet 88, a low heat flux area 92, a high heat flux area 96, and high heat flux channels 100 that may be similar to corresponding components of the channel structure 22. However, in this embodiment there are two low heat flux channels 104 and 108 that provide dual flows through the low heat flux area 92. The inlet 84 may be flow coupled to the inputs 104in and 108in of the low heat flux channels 104 and 108 such that at least a portion of an influent fluid flow enters each channel. Other embodiments may include more than one inlet being flow coupled with the inputs 104in and 108in.

In one embodiment, the low heat flux channels 104 and 108 may have similar flow conditions (e.g., hydraulic diameter, heat flux, distance, etc.), such that the pressure drops over the low heat flux channels 104 and 108 may be substantially the same. Therefore, if this embodiment additionally has the inlet 84 centered with respect to the two-channel inputs $104_{in}$ and $108_{in}$ it may have similar flow distributions across the low heat flux channels 104 and 108.

Various embodiments may adjust the flow distributions of the low heat flux channels 104 and 108 in order to accommodate, e.g., variations in the thermal gradients of the low heat flux area 92. In these embodiments the design of the low heat flux channels 104 and 108 may result in unequal flow distributions through the low heat flux area 92. Additionally, the number, pattern, and orientation of the low heat flux channels 104 and 108 may each be adjusted to accommodate the variables of a particular embodiment.

The low heat flux channels 104 and 108 may have outputs $104_{out}$ and $108_{out}$ that are flow coupled with inputs $100_{in}$ of high heat flux channels 100, such that at least a portion of the low heat flux flows enter at least some of the high heat flux channels 100. In one embodiment, the outputs $104_{out}$ and $108_{out}$ may be designed such that they present the fluid flows to the high heat flux channels 100 in a distributed manner to at least facilitate a desired flow distribution through the high heat flux channels 100. In one embodiment, the high heat flux channels 100 may have similar flow conditions such that substantially equivalent pressure drops result in substantially even flow distributions over the range of high heat flux channels 100.

Figure 5:
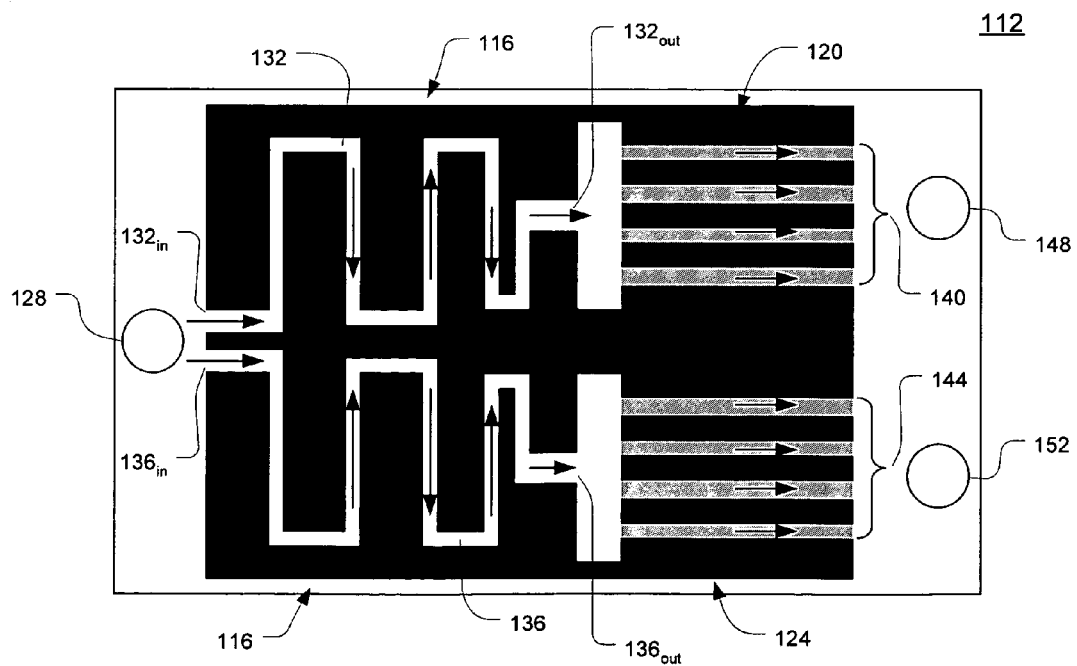
FIG. 5 illustrates a top view of a channel structure with dual low heat flux channels and high heat flux areas, in accordance with an embodiment of the present invention.

FIG. 5 illustrates a channel structure 112 with low heat flux channels respectively corresponding to high heat flux channels, in accordance with an embodiment of the present invention. The channel structure 112 may be interchangeable with the channel structure 22 of FIGS. 1 and 2. However, in this embodiment, the channels may be designed to adapt flows for a low heat flux area 116 and two high heat flux areas 120 and 124. In various embodiments the high heat flux areas 120 and 124 may have similar heat fluxes. In other embodiments the high heat flux areas 120 and 124 may have different heat fluxes.

The channel structure 112 may have an inlet 128 flow coupled to inputs 132in and 136in of low heat flux channels 132 and 136. Each of the low heat flux channels 132 and 136 may travel over respective portions of the low heat flux area 116 prior to being flow coupled to high heat flux channels 140 and 144 at outputs $132_{out}$ and $136_{out}$, respectively. In one embodiment, the high heat flux channels 140 and 144 may be flow coupled to outlets 148 and 152, respectively. In another embodiment the high heat flux channels may be coupled to the same outlet. Additionally, various embodiments may include more than one inlet coupled to the low heat flux channel inputs $132_{in}$ and $136_{in}$.

Although as depicted the channels 132 and 120 are oriented symmetrically with channels 136 and 124, other embodiments may include asymmetrical orientations as well.

In one embodiment, the channel structure 112 may be used in an electronic assembly with a semiconductor package having a dual-core processor. In such an embodiment the dual-core logic areas may correspond to the high heat flux areas 120 and 124. In various embodiments, the channel structure 112 may be adapted to correspond with multi-core processors or chipset configurations that have multiple areas with varying heat fluxes.

Figure 6:
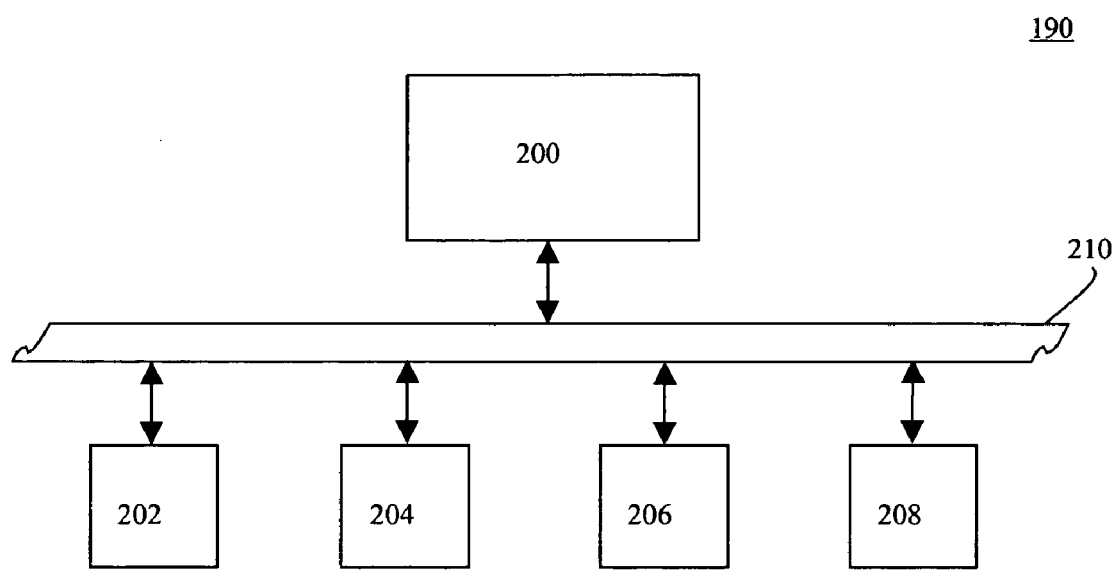
FIG. 6 illustrates a system with an electronic assembly, in accordance with an embodiment of the present invention.

Referring to FIG. 6, there is illustrated one of many possible systems in which embodiments of the present invention may be used. The electronic assembly 200 may be similar to the electronic assembly 18 depicted above in FIG. 1. In one embodiment, the electronic assembly 200 may include a microprocessor. In an alternate embodiment, the electronic assembly 200 may include an application specific IC (ASIC). Integrated circuits found in chipsets (e.g., graphics, sound, and control chipsets) may also be packaged in accordance with embodiments of this invention.

For the embodiment depicted by FIG. 6, the system 190 may also include a main memory 202, a graphics processor 204, a mass storage device 206, and/or an input/output module 208 coupled to each other by way of a bus 210, as shown. Examples of the memory 202 include but are not limited to static random access memory (SRAM) and dynamic random access memory (DRAM). Examples of the mass storage device 206 include but are not limited to a hard disk drive, a compact disk drive (CD), a digital versatile disk drive (DVD), and so forth. Examples of the input/output modules 208 include but are not limited to a keyboard, cursor control devices, a display, a network interface, and so forth. Examples of the bus 210 include but are not limited to a peripheral control interface (PCI) bus, and Industry Standard Architecture (ISA) bus, and so forth. In various embodiments, the system 190 may be a wireless mobile phone, a personal digital assistant, a pocket PC, a tablet PC, a notebook PC, a desktop computer, a set-top box, a media-center PC, a DVD player, and a server.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:
1. An apparatus comprising:
   a cooling channel to correspond to a first area of a semiconductor package having a first heat flux, the cooling channel having a hydraulic diameter and length configured to facilitate single-phase flow;

a plurality of other cooling channels to correspond to a second area of the semiconductor package having a second heat flux that is greater than the first heat flux, each of the plurality of other cooling channels having a hydraulic diameter similar to one another and being arranged in parallel with one another, the plurality of other channels having hydraulic diameters and lengths configured to facilitate two-phase flow; and the cooling channel to be flow coupled to the plurality of other cooling channels.

2. The apparatus of claim 1, wherein the cooling channel forms a serpentine pattern through the first area.

3. The apparatus of claim 1, further comprising:
a first inlet to be directly flow coupled to the cooling channel.

4. The apparatus of claim 3, further comprising:
a first outlet to be directly flow coupled to the plurality of other cooling channels.

5. The apparatus of claim 4, further comprising:
another cooling channel to correspond to the first area.

6. The apparatus of claim 5, wherein the first inlet is directly flow coupled to the another cooling channel.

7. The apparatus of claim 5, further comprising:
a second inlet to be directly flow coupled to the another cooling channel.

8. The apparatus of claim 5, wherein the another cooling channel is flow coupled to the plurality of other cooling channels to provide fluid to the plurality of other cooling channels.

9. The apparatus of claim 5, further comprising:
another plurality of other cooling channels, separate from the plurality of other cooling channels, to correspond to a third area having a third heat flux; and
the another cooling channel to be flow coupled to the another plurality of cooling channels.

10. The apparatus of claim 9, wherein the another plurality of other cooling channels are flow coupled to the first outlet.

11. The apparatus of claim 9, further comprising:
a second outlet; and
the another plurality of other cooling channels to be flow coupled to the second outlet.

12. The apparatus of claim 9, wherein the third heat flux is greater than the first heat flux.

13. The apparatus of claim 1, wherein the cooling channel is flow coupled to the plurality of other channels in a manner parallel to the plurality of other channels.

14. A method comprising:
providing a first fluid flow for cooling a first area of a semiconductor package having a first heat flux, the first fluid flow being a single-phase flow; and
dividing at least a portion of the first fluid flow into second and third fluid flows for cooling a second area of the semiconductor package having a second heat flux that is greater than the first heat flux, the second and third fluid flows being two-phase flows with development from the single-phase flow into the two-phase flows occurring at or about the division of at least the portion of the first fluid flow into the second and third fluid flows.

15. The method of claim 14, further comprising:
absorbing at least a portion of the first heat flux in the first fluid flow; and
absorbing at least a portion of the second heat flux in the second and third fluid flows.

16. The method of claim 15, further comprising:
transferring at least a portion of the absorbed heat of the first and second fluid flows to a remote heat exchanger.

17. The method of claim 14, further comprising:
providing a fourth fluid flow for the first area as a single-phase flow.

18. The method of claim 17, further comprising:
dividing at least a portion of the fourth cooling fluid flow into the second and third fluid flows.

19. The method of claim 14, further comprising:
providing a fifth and a sixth fluid flows, separate from the second and third fluid flows, for a third area of the semiconductor package with a third heat flux that is greater than the first heat flux; and
the fifth and sixth fluid flows being two-phase flows and including at least a portion of the fourth cooling flow.

20. A system comprising:
a semiconductor package having an integrated circuit, a first area having a first heat output, and a second area having a second heat output greater than the first heat output;
thermal management arrangement to facilitate the dissipation of heat from the semiconductor package including
a cooling channel thermally coupled to the first area and having a hydraulic diameter and length configured to facilitate single-phase flow; and
a plurality of other channels thermally coupled to the second area and having hydraulic diameters and lengths configured to facilitate two-phase flow, the hydraulic diameters of the plurality of other cooling channels being similar to one another and arranged in parallel to one another;
the cooling channel being flow coupled to the plurality of other cooling channels; and
a mass storage device coupled to the semiconductor package.

21. The system of claim 20, wherein the thermal management arrangement further comprises:
an inlet, directly flow coupled to the cooling channel; and
an outlet, directly flow coupled to the plurality of other cooling channels.

22. The system of claim 21, wherein the thermal management arrangement further comprises:
a pump coupled to the inlet; and
a heat exchanger coupled to the outlet.

23. The system of claim 20, further comprising:
a dynamic random access memory coupled to the integrated circuit; and
an input/output interface coupled to the integrated circuit.

24. The system of claim 23, wherein the input/output interface comprises a networking interface.

25. The system of claim 20, wherein the first area of the semiconductor package includes core logic of the integrated circuit and the second area of the semiconductor package includes a cache of the integrated circuit.

26. The system of claim 20, wherein the integrated circuit is a processor.

27. The system of claim 26, wherein the system is a selected one of a group consisting of a set-top box, a media-center personal computer, and a digital versatile disk player.

28. The system of claim 20, wherein the cooling channel is flow coupled to the plurality of other channels in a manner parallel to the plurality of other channels.

* * * * *

UNITED STATES PATENT AND TRADEMARK OFFICE
CERTIFICATE OF CORRECTION

| | | |
|---|---|---|
| PATENT NO. | : 7,218,519 B2 | Page 1 of 1 |
| APPLICATION NO. | : 10/869186 | |
| DATED | : May 15, 2007 | |
| INVENTOR(S) | : Prasher et al. | |

It is certified that error appears in the above-identified patent and that said Letters Patent is hereby corrected as shown below:

Column 8

Line 22, Claim 20 "...thermal management..." should read --...a thermal management...--.

Signed and Sealed this

Thirtieth Day of September, 2008

JON W. DUDAS
*Director of the United States Patent and Trademark Office*